US006693464B2

(12) United States Patent
Cojocaru

(10) Patent No.: US 6,693,464 B2
(45) Date of Patent: Feb. 17, 2004

(54) LOW-VOLTAGE CURRENT MODE LOGIC CIRCUITS AND METHODS

(75) Inventor: Christian Cojocaru, Ottawa (CA)

(73) Assignee: Skyworks Solutions, Inc., Newport Beach, CA (US)

(*) Notice: Subject to any disclaimer, the term of this patent is extended or adjusted under 35 U.S.C. 154(b) by 0 days.

(21) Appl. No.: 10/172,707

(22) Filed: Jun. 14, 2002

(65) Prior Publication Data

US 2003/0231031 A1 Dec. 18, 2003

(51) Int. Cl.[7] .................. H03K 19/086; H03K 19/0175
(52) U.S. Cl. .......................................... 326/127; 326/75
(58) Field of Search ................. 326/126–127, 326/115–116, 75, 77–78

(56) References Cited

U.S. PATENT DOCUMENTS

| | | | | |
|---|---|---|---|---|
| 3,974,402 A | * | 8/1976 | Fett et al. | 326/78 |
| 4,488,063 A | * | 12/1984 | Lee | 327/199 |
| 4,605,871 A | * | 8/1986 | Price et al. | 326/126 |
| 6,028,454 A | | 2/2000 | Elmasry et al. | 326/115 |

FOREIGN PATENT DOCUMENTS

JP            62071329 A   *   4/1987   ......... H03K/19/092

* cited by examiner

*Primary Examiner*—James H. Cho
(74) *Attorney, Agent, or Firm*—Thomas, Kayden, Horstemeyer & Risley, LLP

(57) ABSTRACT

A current mode logic (CML) circuit includes an emitter follower circuit, a CML gate, and a Schottky diode that is coupled between the emitter follower circuit and the CML gate. Methods and other systems are also provided.

33 Claims, 6 Drawing Sheets

LOW-VOLTAGE CURRENT MODE LOGIC CIRCUITS AND METHODS

BACKGROUND OF THE INVENTION

1. Field of the Invention

The invention is related to Current Mode Logic (CML) and Emitter Coupled Logic (ECL) circuits.

2. Related Art

Current mode logic (CML) circuits have many applications including multiplexing, frequency division, and implementing logical functions such as AND, NAND, OR, and XOR. FIG. 1 is a block diagram depicting a prior art CML circuit 100. The CML circuit 100 comprises a buffer/inverter module 102, an emitter follower module 104 and a two-level CML gate 106. The buffer/inverter module 102 is used to drive the transistors Q9 and Q10 of the two-level CML gate 106. The buffer/inverter module 102 may be replaced with another module (e.g., a two-level CML gate) that is suitable for driving the transistors Q9 and Q10. The emitter follower module 104 is used to ensure that the buffer/inverter module 102 is compatible with the direct current (DC) level required for the base terminals B9 and B10 of the transistors Q9 and Q10, respectively.

The buffer/inverter module 102 comprises transistors Q1 and Q2 and resistors R1 and R2. The transistor Q1 has a base terminal B1, a collector terminal C1 and an emitter terminal E1. The transistor Q2 has a base terminal B2, a collector terminal C2 and an emitter terminal E2. The resistor R1 is coupled between the voltage source Vs and the collector terminal C1. The resistor R2 is coupled between the voltage source Vs and the collector terminal C2. The emitter terminal E1 and the emitter terminal E2 are coupled to each other and to a current source 110.

The emitter follower module 104 comprises transistors Q3 and Q4. The transistor Q3 has a base terminal B3, a collector terminal C3 and an emitter terminal E3. The base terminal B3 is coupled to a node 124 between the resistor R2 and the collector terminal C2. The emitter terminal E3 is coupled to a current source 112. The transistor Q4 has a base terminal B4, a collector terminal C4 and an emitter terminal E4. The base terminal B4 is coupled to a node 122 between the resistor R1 and the collector terminal C1. The emitter terminal E4 is coupled to a current source 114. The collector terminals C3 and C4 are coupled to the voltage source Vs.

The two-level CML gate 106 comprises transistors Q5, Q6, Q7, Q8, Q9, and Q10 as well as the resistors R5, R6, R7, R8. The transistor Q5 has a base terminal B5, a collector terminal C5, and an emitter terminal E5. A resistor R5 couples between collector terminal C5 and the voltage source Vs. The transistor Q6 has a base terminal B6, a collector terminal C6, and an emitter terminal E6. A resistor R6 couples between collector terminal C6 and the voltage source Vs. The emitter terminals E5 and E6 are coupled to each other.

The transistor Q7 has a base terminal B7, a collector terminal C7, and an emitter terminal E7. A resistor R7 couples between collector terminal C7 and the voltage source Vs. The transistor Q8 has a base terminal B8, a collector terminal C8, and an emitter terminal E8. A resistor R8 couples between collector terminal C8 and the voltage source Vs. The emitter terminals E7 and E8 are coupled to each other.

The transistor Q9 has a base terminal B9, a collector terminal C9, and an emitter terminal E9. The base terminal B9 is coupled to a node 128 between the emitter terminal E4 and the current source 114. The emitter terminal E9 is coupled to a current source 116. The collector terminal C9 is coupled to a node 130 between the emitter terminal E5 and the emitter terminal E6.

The transistor Q10 has a base terminal B10, a collector terminal C10, and an emitter terminal E10. The base terminal B10 is coupled to a node 126 between the emitter terminal E3 and the current source 112. The emitter terminal E10 is coupled to a current source 116. The collector terminal C10 is coupled to a node 132 between the emitter terminal E7 and the emitter terminal E8.

When the CML circuit 100 is in operation, the base terminals B1 and B2 receive inputs for driving the two-level CML gate 106. The two-level CML gate 106 may receive inputs via base terminal B5, B6, B7, and B8, and may provide output via nodes 151–154. The minimum voltage supply required to operate the CML circuit 100 is equal to the sum of the voltage drops across the resistor R1, the base-emitter connection for the transistor Q4, the base-emitter connection for the transistor Q9, and the current source 116. This minimum supply voltage requirement is typically around 2.1 Volts for a circuit temperature of 30° C. and around 2.3 Volts for a circuit temperature of –30° C.

Current Mode Logic circuits such as, for example, CML circuit 100, are frequently used in portable wireless devices where there is a continuing need for lower voltage supply requirements (e.g., 1.8 Volts or less). The need for lower voltage supply requirements is especially great for small wireless devices that run at high frequencies (e.g., over 1 GHz). Therefore, it is desirable to address these and/or other needs related to CML circuits.

SUMMARY

The invention provides a low voltage CML circuit. In one embodiment of the invention, a current mode logic (CML) circuit includes an emitter follower circuit, a CML gate, and a Schottky diode that is coupled between the emitter follower circuit and the CML gate.

Other systems, methods, features, and advantages of the invention will be or become apparent to one with skill in the art upon examination of the following drawings and detailed description. It is intended that all such additional systems, methods, features, and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

Figure 1:
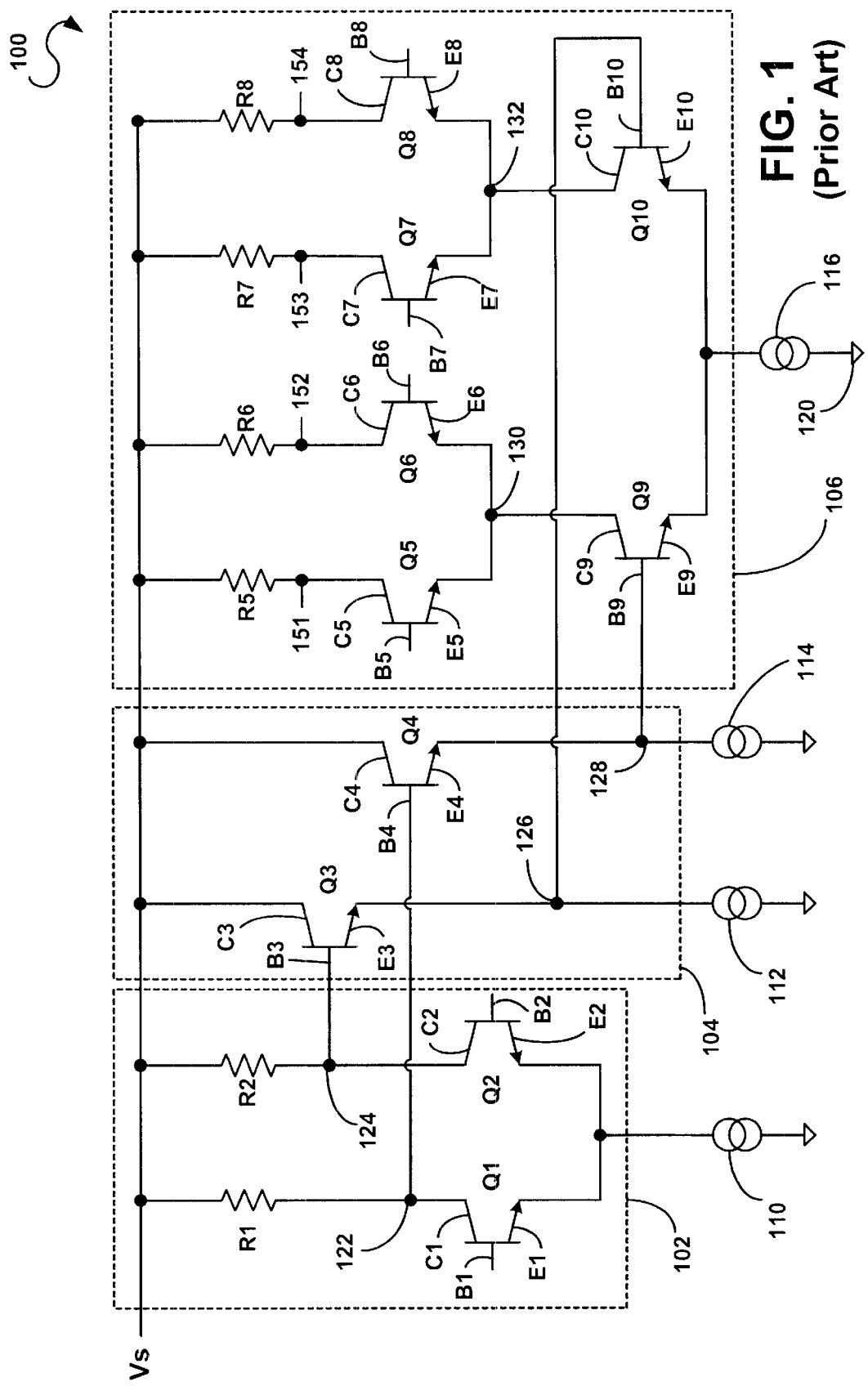
FIG. 1 is a block diagram illustrating a prior art CML circuit.
Figure 2:
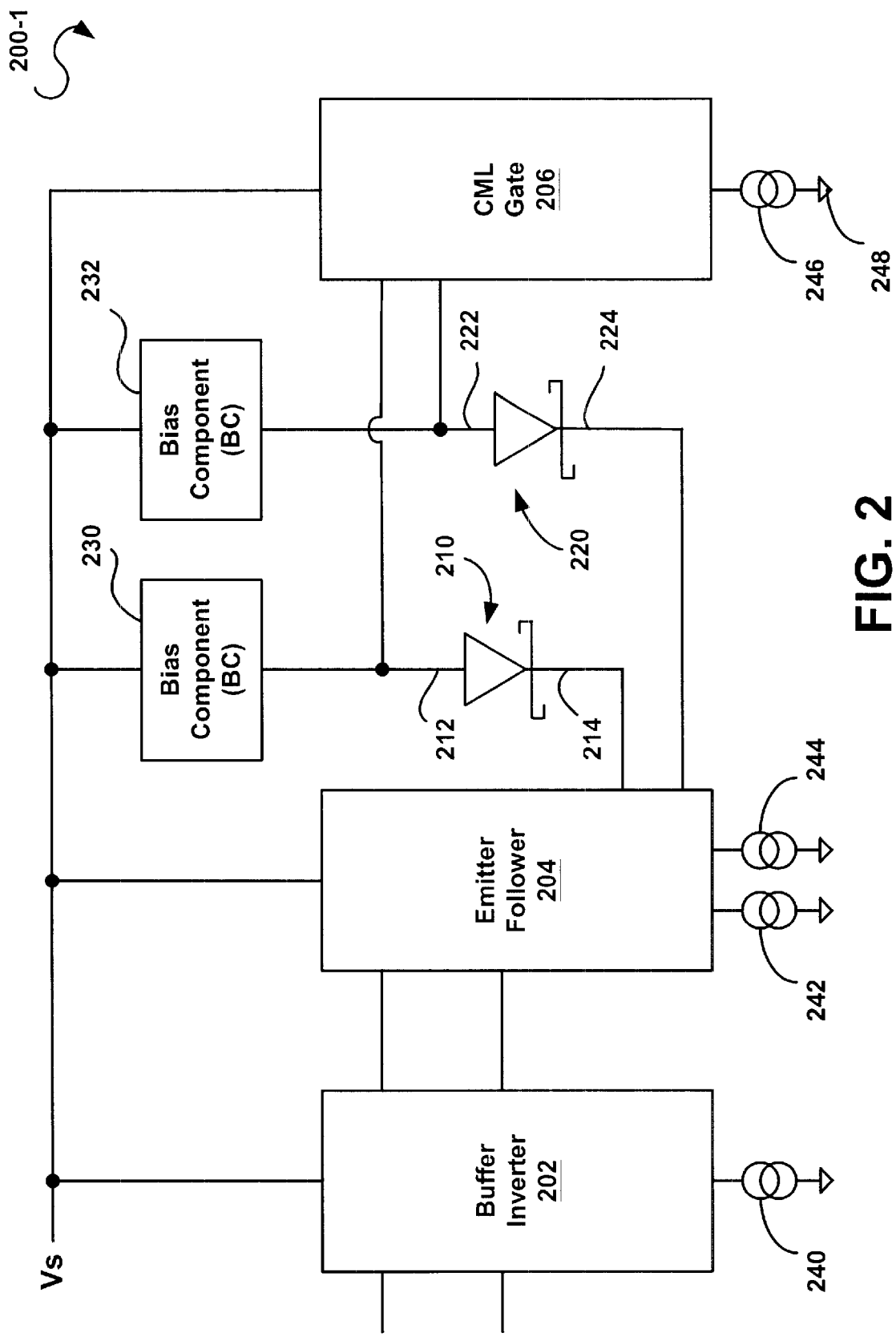
FIG. 2 is a block diagram illustrating a low-voltage CML circuit in accordance with one embodiment of the invention.

FIG. 2 is a block diagram illustrating a CML circuit 200-1 in accordance with one embodiment of the invention. The CML circuit 200-1 comprises a buffer/inverter module 202, an emitter follower module 204, bias components 230 and 232, and a CML gate 206, all of which are coupled to a voltage source Vs. In one possible implementation, the buffer/inverter module 202, the emitter follower module 204, and the CML gate 206 are internally configured in a similar manner as the buffer/inverter module 102, the emitter follower module 104, and the CML gate 106, respectively, of the CML circuit 100 (FIG. 1).

The buffer/inverter module 202 is coupled to the emitter follower module 204 and to a current source 240. The buffer/inverter module 202 may comprise any circuit that is suitable for driving the transistors Q9 and Q10. For example, the buffer/inverter module 202 may comprise a two-level CML gate.

The CML circuit 200-1 further comprises two Schottky diodes 210 and 220 that have anodes 212 and 222, respectively, and cathodes 214 and 224, respectively. The anodes 212 and 222 are coupled to the bias components 230 and 232, respectively, and to the CML gate 206. Each of the bias components 230 and 232 may be, for example, a resistor or a transistor. The cathodes 214 and 224 are coupled to the emitter follower module 204, which is coupled to current sources 242 and 244. Furthermore, a current source 246 is coupled to the CML gate 206.

When the CML circuit 200-1 is in operation, the Schottky diodes 210 and 220 cause the voltage between the emitter follower module 204 and the CML gate 206 to be up-shifted. In one implementation, this voltage up-shift reduces the voltage supply requirement for the CML circuit 300 by about 0.3 Volts as compared to, for example, CML circuit 100 (FIG. 1). One advantage of using a Schottky diode to reduce the voltage supply requirement (e.g., as opposed to using a resistor) is that the Schottky diode provides lower parasitic capacitance and thus favors super high frequency (over 3 GHz) applications. Parasitic capacitance can be problematic since it has to be charged and discharged by the signal path current and hence can limit the operating speed of a CML circuit.

Figure 3:
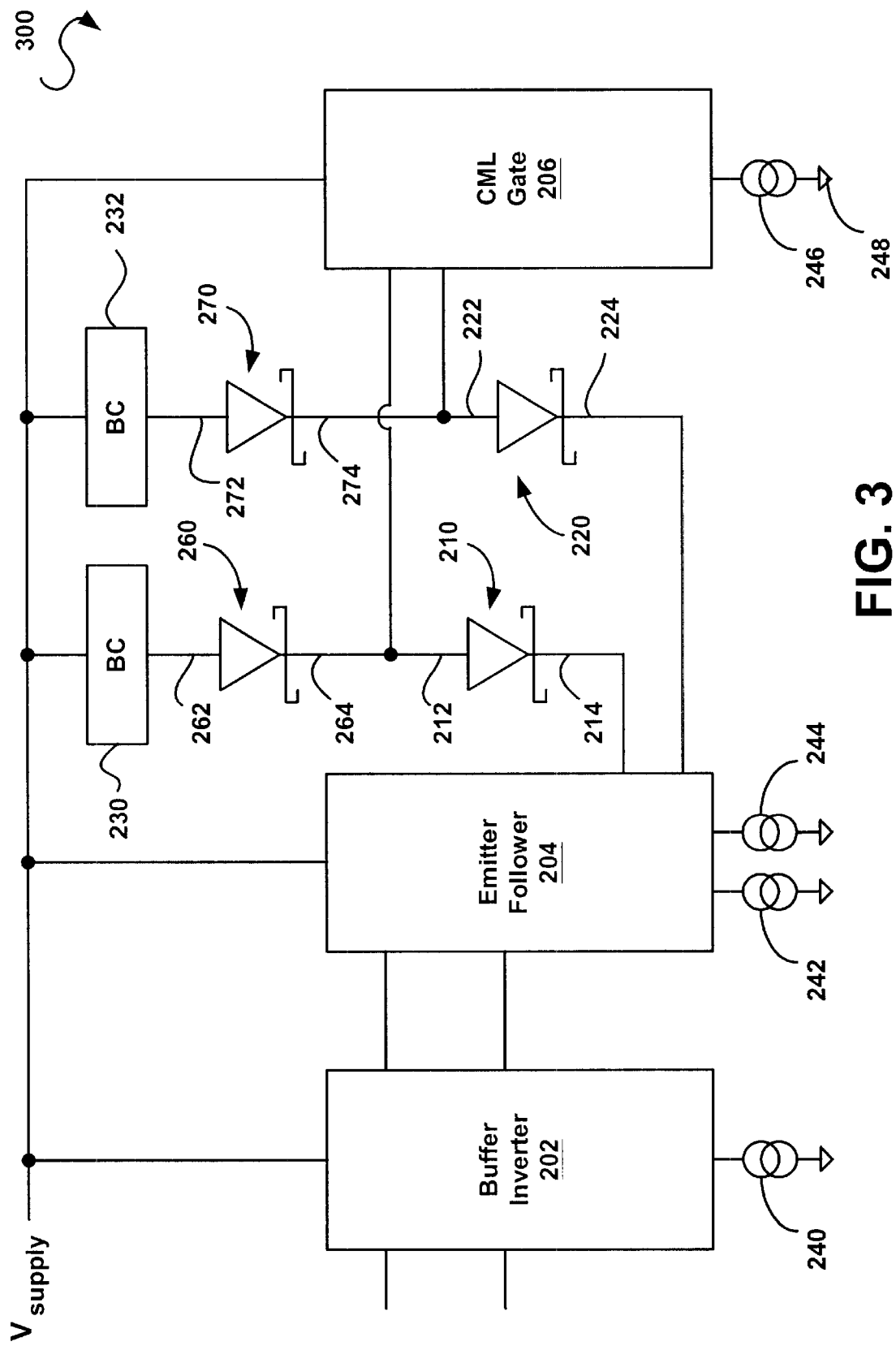
FIG. 3 is a block diagram illustrating a low-voltage CML circuit in accordance with another embodiment of the invention.

FIG. 3 is a block diagram illustrating a CML circuit 300 in accordance with one embodiment of the invention. The CML circuit 300 is similar to the CML circuit 200-1 depicted in FIG. 2, except that two additional Schottky diodes 260 and 270 are included in the CML circuit 300. The Schottky diode 260 has an anode 262 and a cathode 264. The anode 262 is coupled to the bias component 230, whereas the cathode 264 is coupled to the anode 212 of the Schottky diode 210. The Schottky diode 270 has an anode 272 and a cathode 274. The anode 272 is coupled to the bias component 232, whereas the cathode 274 is coupled to the anode 222 of the Schottky diode 220. The Schottky diodes 210 and 220 act to reduce the current flowing through the bias components 230 and 232, thereby reducing the power consumption of the CML circuit 300 as compared to the CML circuit 200-1 (FIG. 2).

Figure 4:
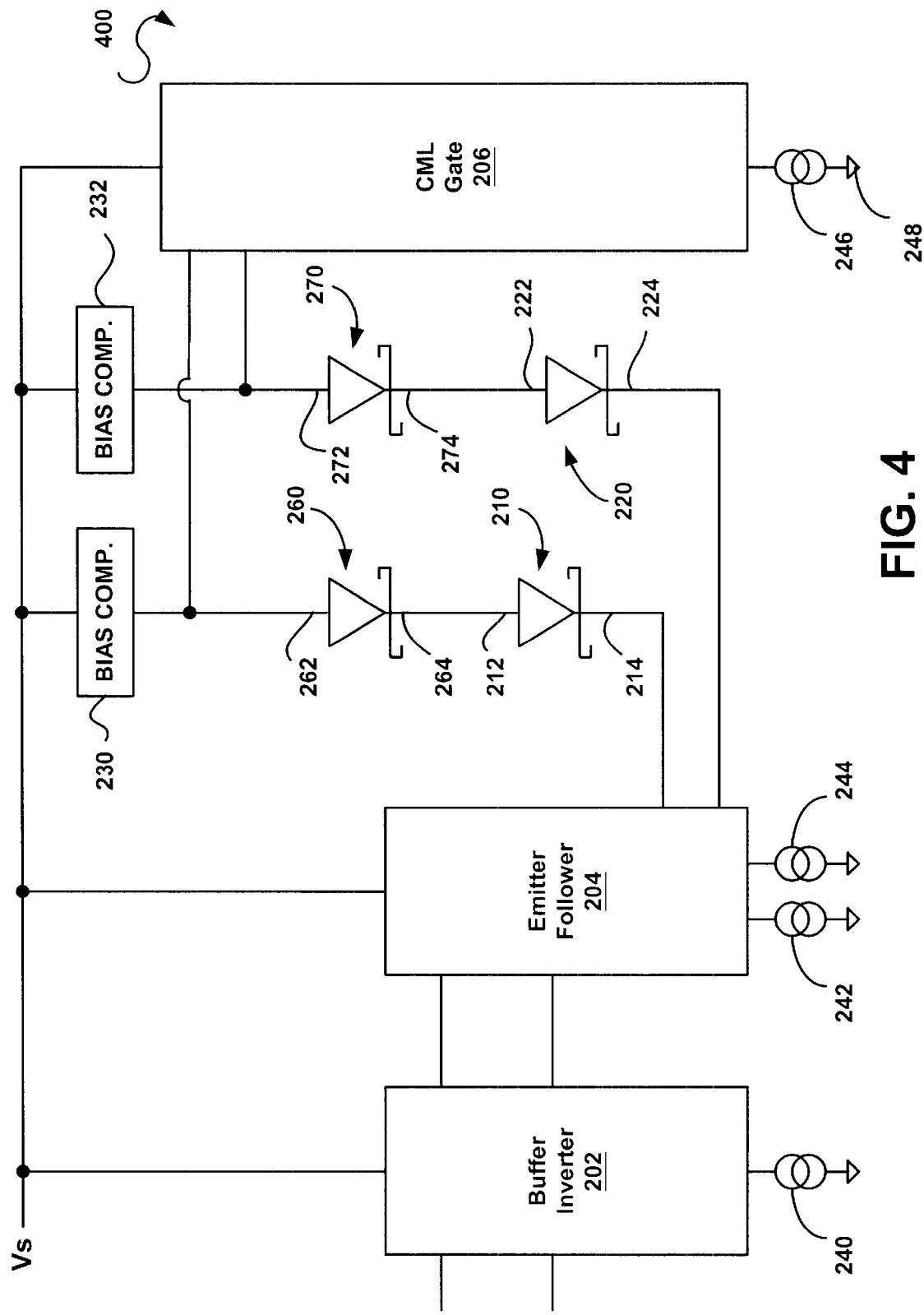
FIG. 4 is a block diagram illustrating a low-voltage CML circuit in accordance with yet another embodiment of the invention.

FIG. 4 is a block diagram illustrating a CML circuit 400 in accordance with one embodiment of the invention. The CML circuit 400 is similar to the CML circuit 200-1 depicted in FIG. 2 except that CML circuit 400 has four Schottky diodes that are coupled between the emitter follower circuit 204 and the CML gate 206. The cathodes 214 and 224 of the Schottky diodes 210 and 220, respectively, are coupled to the emitter follower 204. The anode 212 of the Schottky diode 210 is coupled to the cathode 264 of the Schottky diode 260. Similarly, the anode 222 of the Schottky diode 220 is coupled to the cathode 274 of the Schottky diode 270. The anodes of the Schottky diodes 260 and 270 are coupled to the bias components 230 and 232, respectively, and to the CML gate 206.

When the CML circuit 400 is in operation, the Schottky diodes 210, 220, 260, and 270 cause the voltage between the emitter follower module 204 and the CML gate 206 to be up-shifted. In one implementation, the voltage increase across each Schottky diode is about 0.3 Volts. As a result, the voltage supply requirement for the CML circuit 400 is reduced by about 0.6 Volts as compared to, for example, CML circuit 100 (FIG. 1).

Figure 5:
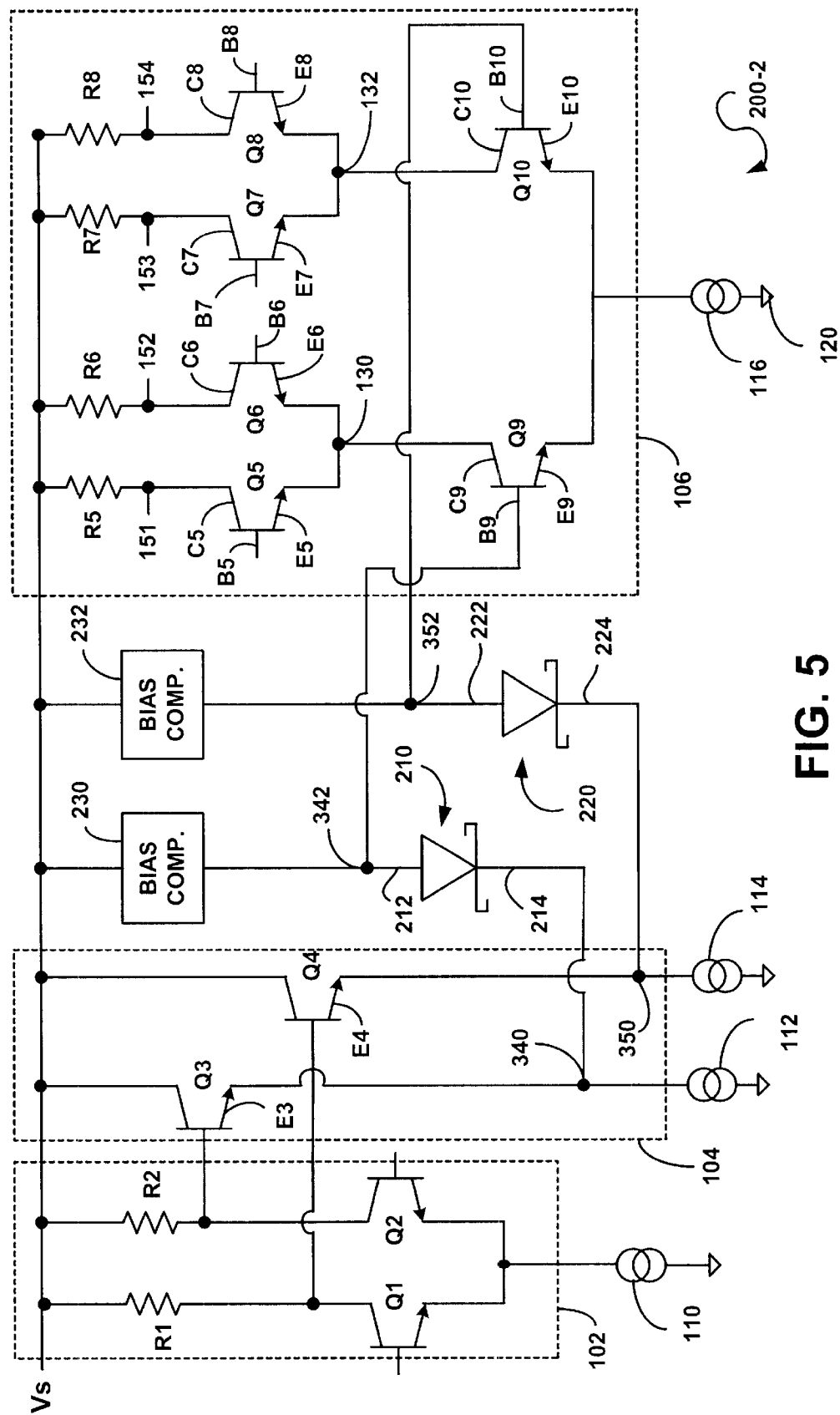
FIG. 5 is a block diagram illustrating one possible implementation of the CML circuit shown in FIG. 2.

FIG. 5 is a block diagram illustrating a CML circuit 200-2 that represents one possible implementation of the CML circuit 200-1 (FIG. 2). The CML circuit 200-2 includes the components of CML circuit 100 (FIG. 1) in addition to Schottky diodes 210 and 220 and bias components 230 and 232. The Schottky diode 210 has an anode 212 and a cathode 214. Similarly, the Schottky diode 220 has an anode 222 and a cathode 224. The cathodes 214 and 224 are coupled to the emitter terminals E3 and E4, respectively. The anode 212 is coupled to the bias component 230 and to the base terminal B9. The anode 222 is coupled to the bias component 232 and the base terminal B10. As mentioned above, the bias components 230 and 232 may be resistors or transistors.

When the CML circuit 200-2 is in operation, the Schottky diodes 210 and 220 cause a voltage up-shift between the output of the emitter follower module 104 and the input of CML gate 106. More specifically, the Schottky diode 210 causes a voltage increase from a lower voltage at node 340 to a higher voltage at node 342. Similarly, Schottky diode 220 causes a voltage increase from a lower voltage at node 350 to a higher voltage at node 352. These increases in voltage result in a lower voltage drop between the voltage source Vs and ground 120. Therefore, the Schottky diodes 210 and 220 reduce the minimum voltage source requirement for the CML circuit 200-2 as compared to other CML circuits (e.g., CML circuit 100).

Figures 6A, 6B:
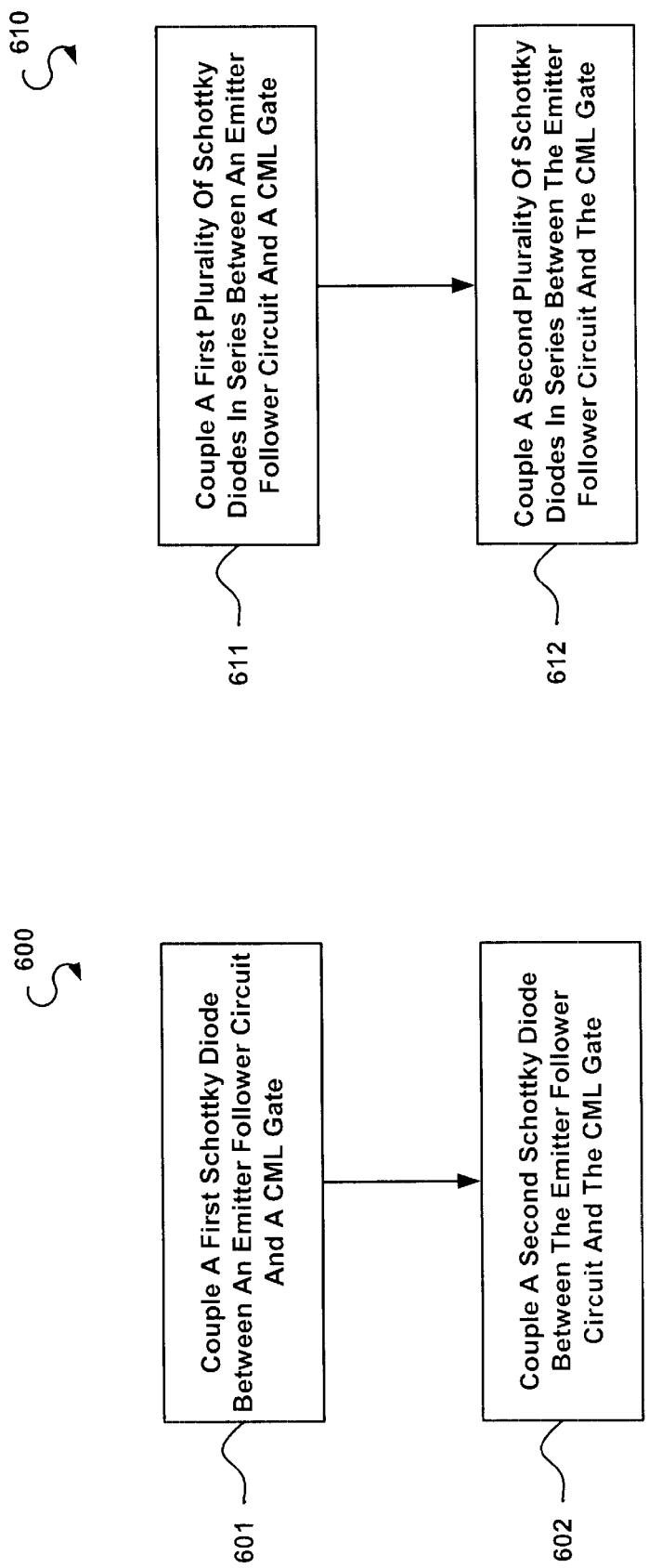
FIG. 6A is a flow chart depicting a method in accordance with one embodiment of the invention.
FIG. 6B is a flow chart depicting a method in accordance with another embodiment of the invention.

FIG. 6A is a flow chart depicting a method 600 in accordance with one embodiment of the invention. As indicated in step 601, a first Schottky diode is coupled between an emitter follower circuit and a CML gate. Furthermore, a second Schottky diode is coupled between the emitter follower circuit and the CML gate, as indicated in step 602. The first and second Schottky diodes may be coupled to the emitter follower circuit and the CML gate as shown, for example, in FIGS. 2, 3, or 5. These steps (601 and 602) may also be performed concurrently or in reverse order, as will be understood by someone of ordinary skill in the art.

FIG. 6B is a flow chart depicting a method 610 in accordance with another embodiment of the invention. As indicated in step 611, a first plurality of Schottky diodes are coupled in series between an emitter follower circuit and a CML gate. Furthermore, a second plurality of Schottky diodes are coupled in series between the emitter follower circuit and the CML gate, as indicated in step 612. The first and second plurality of Schottky diodes may be coupled to the emitter follower circuit and the CML gate as shown, for example, in FIG. 4. These steps (611 and 612) may also be performed concurrently or in reverse order, as will be understood by someone of ordinary skill in the art. Coupling Schottky diodes between an emitter follower circuit and a CML gate as indicated by the methods 600 (FIG. 6A) and 610 (FIG. 6B) reduces the minimum voltage source requirement for a CML circuit that comprises the CML gate and the emitter follower circuit.

While various embodiments of the invention have been described, it will be apparent to those of ordinary skill in the art that many more embodiments and implementations are possible that are within the scope of this invention.

What is claimed is:

1. A current mode logic (CML) circuit comprising:
   an emitter follower circuit;
   a CML gate;
   a first Schottky diode that is coupled between said emitter follower circuit and said CML gate; and
   a second Schottky diode that is coupled between said emitter follower circuit and said CML gate;
   wherein an anode of said first Schottky diode and an anode of said second Schottky diode are coupled to said CML gate.

2. The CML circuit of claim 1, wherein a cathode of said first Schottky diode and a cathode of said second Schottky diode are coupled to said emitter follower circuit.

3. A current mode logic (CML) circuit comprising:
   an emitter follower circuit;
   a CML gate;
   a first Schottky diode that is coupled between said emitter follower circuit and said CML gate; and
   a second Schottky diode that is coupled between said emitter follower circuit and said CML gate;
   wherein a cathode of said first Schottky diode and a cathode of said second Schottky diode are coupled to said emitter follower circuit.

4. The CML circuit of claim 3, wherein an anode of said first Schottky diode and an anode of said second Schottky diode are coupled to said CML gate.

5. A current mode logic (CML) circuit comprising:
   an emitter follower circuit;
   a CML gate;
   a first Schottky diode that is coupled between said emitter follower circuit and said CML gate; and
   a second Schottky diode that is coupled between said emitter follower circuit and said CML gate;
   wherein said CML gate comprises:
      a first transistor and a second transistor that are coupled in parallel to each other;
      a third transistor and a fourth transistor that are coupled in parallel to each other; and
      a fifth transistor and a sixth transistor that are coupled in parallel to each other.

6. The CML circuit of claim 5, wherein:
   said CML gate is a two-level CML gate.

7. A current mode logic (CML) circuit comprising:
   an emitter follower circuit;
   a CML gate;
   a first Schottky diode that is coupled between said emitter follower circuit and said CML gate; and
   a second Schottky diode that is coupled between said emitter follower circuit and said CML gate;
   wherein said CML gate comprises:
      a first transistor and a second transistor that are coupled in parallel to each other;
      a third transistor and a fourth transistor that are coupled in parallel to each other;
      a fifth transistor and a sixth transistor that are coupled in parallel to each other; and
   wherein a collector of the fifth transistor is coupled to an emitter of the first transistor, to an emitter of the second transistor, and to an anode of said first Schottky diode; and
   a collector of the sixth transistor is coupled to an emitter of the third transistor, to an emitter of the fourth transistor, and to an anode of said second Schottky diode.

8. The CML circuit of claim 7, wherein an anode of said first Schottky diode and an anode of said second Schottky diode are coupled to said CML gate, and a cathode of said first Schottky diode and a cathode of said second Schottky diode are coupled to said emitter follower circuit.

9. A current mode logic (CML) circuit comprising:
   an emitter follower circuit;
   a CML gate;
   a first Schottky diode that is coupled between said emitter follower circuit and said CML gate;
   a second Schottky diode that is coupled between said emitter follower circuit and said CML gate;
   a first bias component;
   a second bias component; and
   wherein an anode of said first Schottky diode is coupled to said first bias component, and an anode of said second Schottky diode is coupled to said second bias component.

10. The CML circuit of claim 9, wherein:
    said emitter follower circuit comprises a first transistor and a second transistor that are coupled in parallel.

11. A current mode logic (CML) circuit comprising:
    an emitter follower circuit;
    a CML gate;
    a first Schottky diode that is coupled between said emitter follower circuit and said CML gate;
    a second Schottky diode that is coupled between said emitter follower circuit and said CML gate;
    a first bias component;
    a second bias component;
    wherein an anode of said first Schottky diode is coupled to said first bias component, and an anode of said second Schottky diode is coupled to said second bias component; and
    wherein said bias components are resistors.

12. The CML circuit of claim 11, wherein said anode of said first Schottky diode and said anode of said second Schottky diode are coupled to said CML gate.

13. A current mode logic (CML) circuit comprising:
    an emitter follower circuit;
    a CML gate;
    a first Schottky diode that is coupled between said emitter follower circuit and said CML gate;
    a second Schottky diode that is coupled between said emitter follower circuit and said CML gate;
    a first bias component;
    a second bias component;
    wherein an anode of said first Schottky diode is coupled to said first bias component, and an anode of said second Schottky diode is coupled to said second bias component; and
    wherein said bias components are transistors.

14. The CML circuit of claim 13, wherein said anode of said first Schottky diode and said anode of said second Schottky diode are coupled to said CML gate.

15. A current mode logic (CML) circuit comprising:
an emitter follower circuit;
a CML gate;
a first Schottky diode that is coupled between said emitter follower circuit and said CML gate;
a second Schottky diode that is coupled between said emitter follower circuit and said CML gate;
a first bias component;
a second bias component;
wherein an anode of said first Schottky diode is coupled to said first bias component, and an anode of said second Schottky diode is coupled to said second bias component; and
wherein said bias components are is coupled to a voltage supply.

16. The CML circuit of claim 15, wherein said anode of said first Schottky diode and said anode of said second Schottky diode are coupled to said CML gate.

17. A current mode logic (CML) circuit comprising:
an emitter follower circuit;
a CML gate;
a first Schottky diode that is coupled between said emitter follower circuit and said CML gate; and
a second Schottky diode that is coupled between said emitter follower circuit and said CML gate;
wherein an anode of said first Schottky diode is coupled to a cathode of a third Schottky diode and an anode of said second Schottky diode is coupled to a cathode of a fourth Schottky diode.

18. The CML circuit of claim 17, wherein:
said emitter follower circuit comprises a first transistor and a second transistor that are coupled in parallel;
a cathode of said first Schottky diode is coupled to an emitter of the first transistor; and
a cathode of said second Schottky diode is coupled to an emitter of the second transistor.

19. A current mode logic (CML) circuit comprising:
an emitter follower circuit;
a CML gate;
a first Schottky diode that is coupled between said emitter follower circuit and said CML gate; and
a second Schottky diode that is coupled between said emitter follower circuit and said CML gate;
wherein said emitter follower circuit comprises a first transistor and a second transistor that are coupled in parallel;
wherein a cathode of said first Schottky diode is coupled to an emitter of the first transistor; and
wherein a cathode of said second Schottky diode is coupled to an emitter of the second transistor.

20. The CML circuit of claim 19, wherein an anode of said first Schottky diode and an anode of said second Schottky diode are coupled to said CML gate.

21. A method for reducing a voltage supply requirement for a current mode logic (CML) circuit that includes an emitter follower circuit and a CML gate, the method comprising the steps of:
coupling a first Schottky diode between the emitter follower circuit and the CML gate;
coupling a second Schottky diode between the emitter follower circuit and the CML gate; and
coupling an anode of the first Schottky diode and an anode of the second Schottky diode to the CML gate.

22. The method of claim 21, further comprising:
coupling a cathode of the first Schottky diode and a cathode of the second Schottky diode to the emitter follower circuit.

23. A method for reducing a voltage supply requirement for a current mode logic (CML) circuit that includes an emitter follower circuit and a CML gate, the method comprising the steps of:
coupling a first Schottky diode between the emitter follower circuit and the CML gate;
coupling a second Schottky diode between the emitter follower circuit and the CML gate; and
coupling a cathode of the first Schottky diode and a cathode of the second Schottky diode to the emitter follower circuit.

24. The method of claim 23, further comprising:
coupling an anode of the first Schottky diode and an anode of the second Schottky diode to the CML gate.

25. A method for reducing a voltage supply requirement for a current mode logic (CML) circuit that includes an emitter follower circuit and a CML gate, the method comprising the steps of:
coupling a first Schottky diode between the emitter follower circuit and the CML gate;
coupling a second Schottky diode between the emitter follower circuit and the CML gate;
coupling an anode of the first Schottky diode to a cathode of a third Schottky diode; and
coupling an anode of the second Schottky diode to a cathode of a fourth Schottky diode.

26. The method of claim 25, wherein:
said emitter follower circuit comprises a first transistor and a second transistor that are coupled in parallel;
a cathode of said first Schottky diode is coupled to an emitter of the first transistor; and
a cathode of said second Schottky diode is coupled to an emitter of the second transistor.

27. A method for reducing a voltage supply requirement for a current mode logic (CML) circuit that includes an emitter follower circuit and a CML gate, the method comprising the steps of:
coupling a first Schottky diode between the emitter follower circuit and the CML gate;
coupling a second Schottky diode between the emitter follower circuit and the CML gate, wherein the emitter follower circuit comprises
a first transistor and a second transistor that are coupled in parallel;
coupling a cathode of the first Schottky diode to an emitter of the first transistor;
coupling a cathode of the second Schottky diode to an emitter of the second transistor.

28. The method of claim 27, wherein an anode of said first Schottky diode and an anode aid second Schottky diode are coupled to said CML gate.

29. A method for reducing a voltage supply requirement for a current mode logic (CML) circuit that includes an emitter follower circuit and a two-level CML gate, the method comprising:
up-shifting a voltage from a lower voltage at a first node contained in the emitter follower circuit to a higher voltage at a second node contained in the two-level CML gate; and up-shifting a voltage from a lower voltage at a third node contained in the emitter follower circuit to a higher voltage at a fourth node contained in the two-level CML gate.

30. The method of claim 29, wherein the two-level CML gate comprises:
   a first transistor and a second transistor that are coupled in parallel to each other;
   a third transistor and a fourth transistor that are coupled in parallel to each other; and
   a fifth transistor and a sixth transistor that are coupled in parallel to each other;
   wherein the collector of the fifth transistor is coupled to an emitter of the first transistor and to the emitter of the second transistor; and
   wherein the collector of the sixth transistor is coupled to an emitter of the third transistor and to the emitter of the fourth transistor.

31. The method of claim 30, wherein the second node is coupled to a base of the fifth transistor and the fourth node is coupled to a base of the sixth transistor.

32. The method of claim 29, wherein the emitter follower circuit comprises:
   a first transistor and a second transistor that are coupled in parallel.

33. The method of claim 32, wherein the first node is coupled to an emitter of the first transistor and the third node is coupled to an emitter of the second transistor.

* * * * *